United States Patent [19]
Davis et al.

[11] Patent Number: 5,089,723
[45] Date of Patent: Feb. 18, 1992

[54] CMOS-BASED PSEUDO ECL OUTPUT BUFFER

[75] Inventors: Craig M. Davis, Puyallup, Wash.; Richard R. Rasmussen, Fremont, Calif.

[73] Assignee: National Semiconductor Corporation, Santa Clara, Calif.

[21] Appl. No.: 613,291

[22] Filed: Nov. 15, 1990

[51] Int. Cl.[5] .............. H03K 19/094; H03K 19/0175
[52] U.S. Cl. .................. 307/451; 307/455; 307/475; 307/354; 307/242
[58] Field of Search ........ 307/443, 448, 451, 455, 307/475, 354, 242

[56] References Cited

U.S. PATENT DOCUMENTS

| | | | |
|---|---|---|---|
| 4,841,175 | 6/1989 | De Man et al. | 307/455 |
| 4,945,258 | 7/1990 | Picard et al. | 307/455 |
| 4,947,061 | 8/1990 | Metz et al. | 307/455 |

OTHER PUBLICATIONS

Schumacher et al, "CMOS Subnanosecond True-ECL Output Buffer", IEEE Journal of Solid-State Circuits, vol. 25, No. 1, Feb. 1990, pp. 150-154.

Primary Examiner—Stanley D. Miller
Assistant Examiner—Margaret Rose Wambach
Attorney, Agent, or Firm—Limbach & Limbach

[57] ABSTRACT

The present invention provides a CMOS output buffer with ECL output characteristics that allows the outputs to be terminated in any manner desired and which is not limited by the op amp settling time. The buffer establishes a bus internally for the VOH and VOL levels and then switches between the buses using transmission gates. In the disclosed embodiment of the invention, the op amp's feedback path includes a P-channel device which is either identical to or, to conserve power, a carefully scaled down equivalent of the P-channel output device.

6 Claims, 3 Drawing Sheets

CMOS-BASED PSEUDO ECL OUTPUT BUFFER

BACKGROUND OF THE INVENTION

1. Field of the Invention

The present invention relates to semiconductor integrated circuits and, in particular, to techniques for obtaining an ECL characteristic output using CMOS transistor elements.

2. Discussion of the Prior Art

High speed integrated circuits are often designed in emitter-coupled-logic (ECL) technology which is well known for its high speed operation. ECL is a non-saturating form of digital logic that eliminates transistor storage time as a speed-limiting characteristic. However, as a trade-off for high speed operation, ECL is the least efficient integrated circuit technology in terms of power dissipation, making it unsuitable for many high density VLSI circuit applications.

Complementary metal oxide semiconductor (CMOS) technology, on the other hand, provides high density circuitry for VLSI applications with low power dissipation.

Therefore, a combination of CMOS VLSI circuits with ECL-compatible input/output buffers provides fast, high-density circuits that have relatively low power dissipation.

Schumacher et al, "CMOS Subnanosecond True-ECL Output Buffer", IEEE Journal of Solid-Sate Circuits, Vol. 25, No. 1, February 1990, pp. 150-154, describe an ECL-compatible output buffer fabricated utilizing CMOS technology.

The Schumacher et al circuit, shown in FIG. 1, requires that the operational amplifier 10 utilized to drive the P-channel output transistor 12 switch from the ECL high level reference voltage VOH to the ECL low level reference voltage VOL on the fly as the output buffer switches. This limits the logic transition time and complicates the criteria for stable op amp operation. The Schumacher et al approach also necessitates the duplication of the op amp circuit for every output buffer.

SUMMARY OF THE INVENTION

The present invention provides a CMOS output buffer with ECL output characteristics that allows the outputs to be terminated in any manner desired and which is not limited by the op amp settling time. The buffer establishes a bus internally for the VOH and VOL levels and then switches between the buses using transmission gates. In the disclosed embodiment of the invention, the op amp's feedback path includes a P-channel transistor which is either identical to or, to conserve power, a carefully scaled down equivalent of the P-channel output transistor.

This design reduces the transient response behavior problems associated with the op amp, allows the op amp and buses to be shared among several outputs and reduces the logic transition time.

Other features and advantages of the present invention will be more fully understood and appreciated upon consideration of the following detailed description of the invention which should be considered in conjunction with the accompanying drawings.

DETAILED DESCRIPTION OF THE INVENTION

Figure 1:
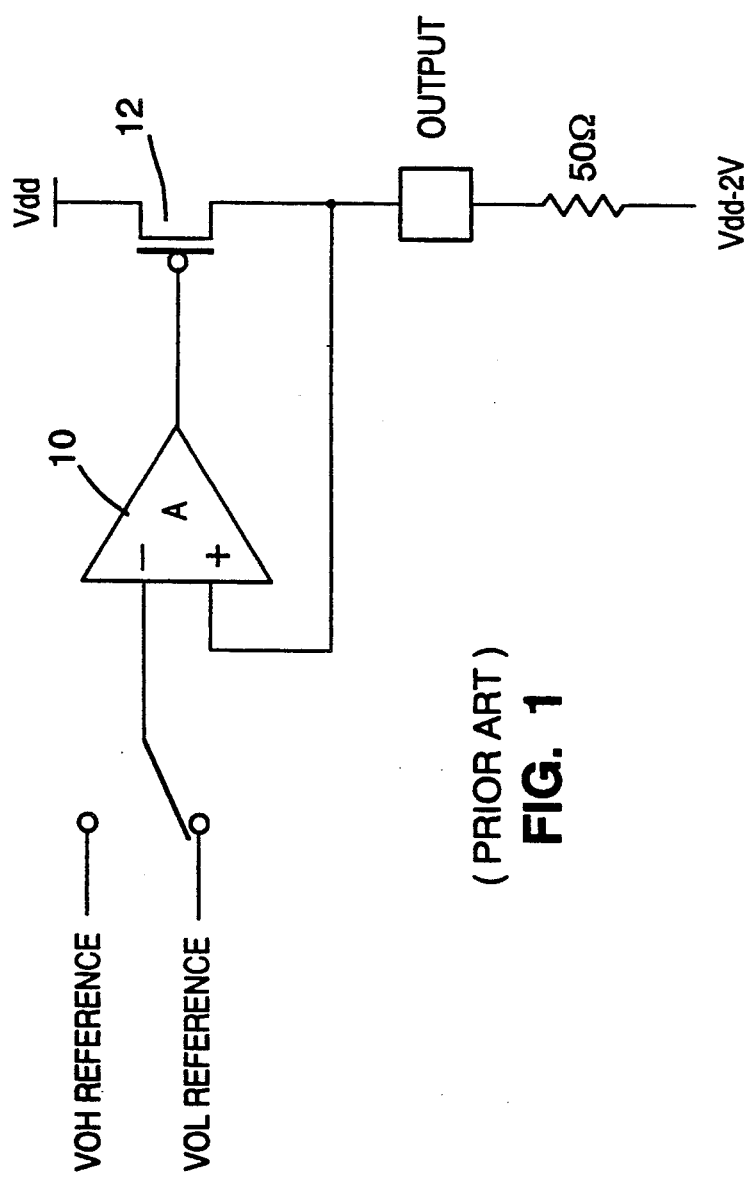
FIG. 1 is a schematic diagram illustrating a prior art CMOS-based ECL output buffer.
Figure 2:
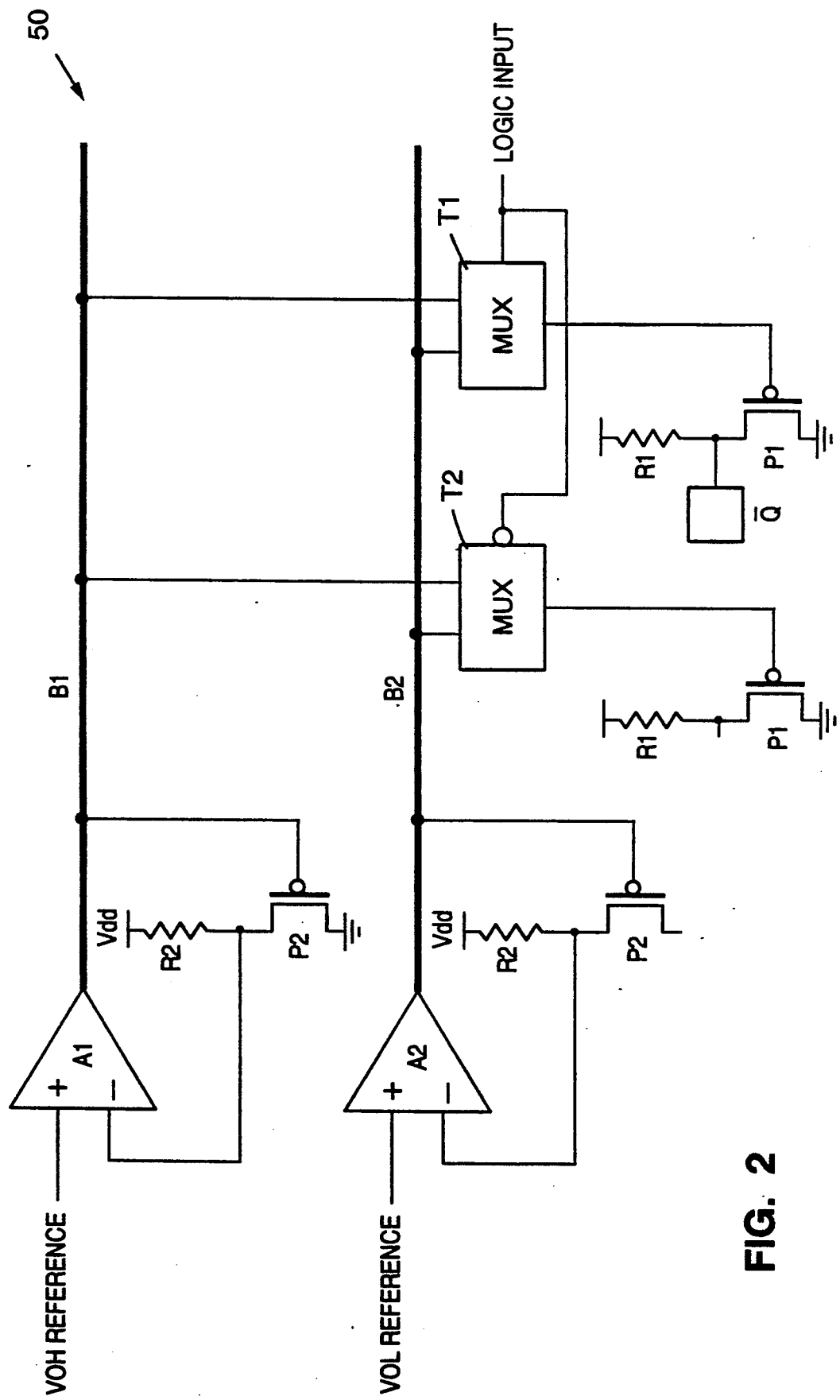
FIG. 2 is a schematic diagram illustrating an embodiment of a CMOS-based ECL output buffer in accordance with the present invention.

FIG. 2 shows a CMOS-based ECL output buffer 50 in accordance with the present invention. The output buffer 50 includes a high level bus B1 and a low level bus B2. A first CMOS operational amplifier A1 has its non-inverting input connected to receive a high ECL-level reference voltage VOH. The output of operational amplifier A1 is connected to the high level bus B1. The first CMOS operational amplifier A1 further includes a feedback path, described in greater detail below, connected between the high level bus and the inverting input of the operational amplifier A1 such that the high level bus B1 reflects the high ECL-level reference voltage VOH.

A second CMOS operational amplifier A2 has its non-inverting input connected to receive a low ECL-level reference voltage VOL. The output of operational amplifier A2 is connected to the low level bus B2. Operational amplifier A2 also includes a feedback path connected between the low level bus B2 and the inverting input of the operational amplifier A2 such that the low level bus B2 reflects the low ECL-level reference voltage VOL.

Output buffer circuit 50 also includes first and second transmission gates T1 and T2 each of which has first and second inputs connected to the high and low ECL-level buses B1 and B2, respectively, and is responsive to first and second logic states of a logic input control signal for providing the high ECL-level reference voltage (or its complement) or the low ECL-level reference voltage (or its complement), respectively, as a transmission gate output signal.

The output of each transmission gate T1 and T2 is provided to an output switch, described in greater detail below, which is responsive to the transmission gate output signal for providing a corresponding output transistor gate signal to an output node.

The output buffer 50 uses an output driver P-channel transistors P1 connected as source followers. This embodiment of the invention requires an unconventional termination of the external transmission line resistors R1 and R2 to Vcc, but provides a slightly faster logic transition. This embodiment also enables an internal feedback P-channel transistor P2 to be identically terminated without porting in Vcc-2V for a load supply return.

More specifically, the output switch of the output buffer 50 includes an output driver P-channel transistor P1 having its gate connected to receive the transmission gate output signal, its drain connected to a negative supply voltage, and its source connected to an output node. The output node is also connected to a positive supply voltage via the external transmission line resistor R1.

The operational amplifier feedback paths include a feedback P-channel transistor P2 having its gate connected to the corresponding bus, its drain connected to the negative supply voltage and its source node connected to the inverting input of the corresponding operational amplifier. The source node is also connected to the positive supply voltage via a feedback resistor R2.

The feedback P-channel transistor P2 can be identical to the output driver P-channel transistor P1 or, to conserve power, can be a carefully scaled down equivalent of the P-channel output transistor P1.

Figure 3:
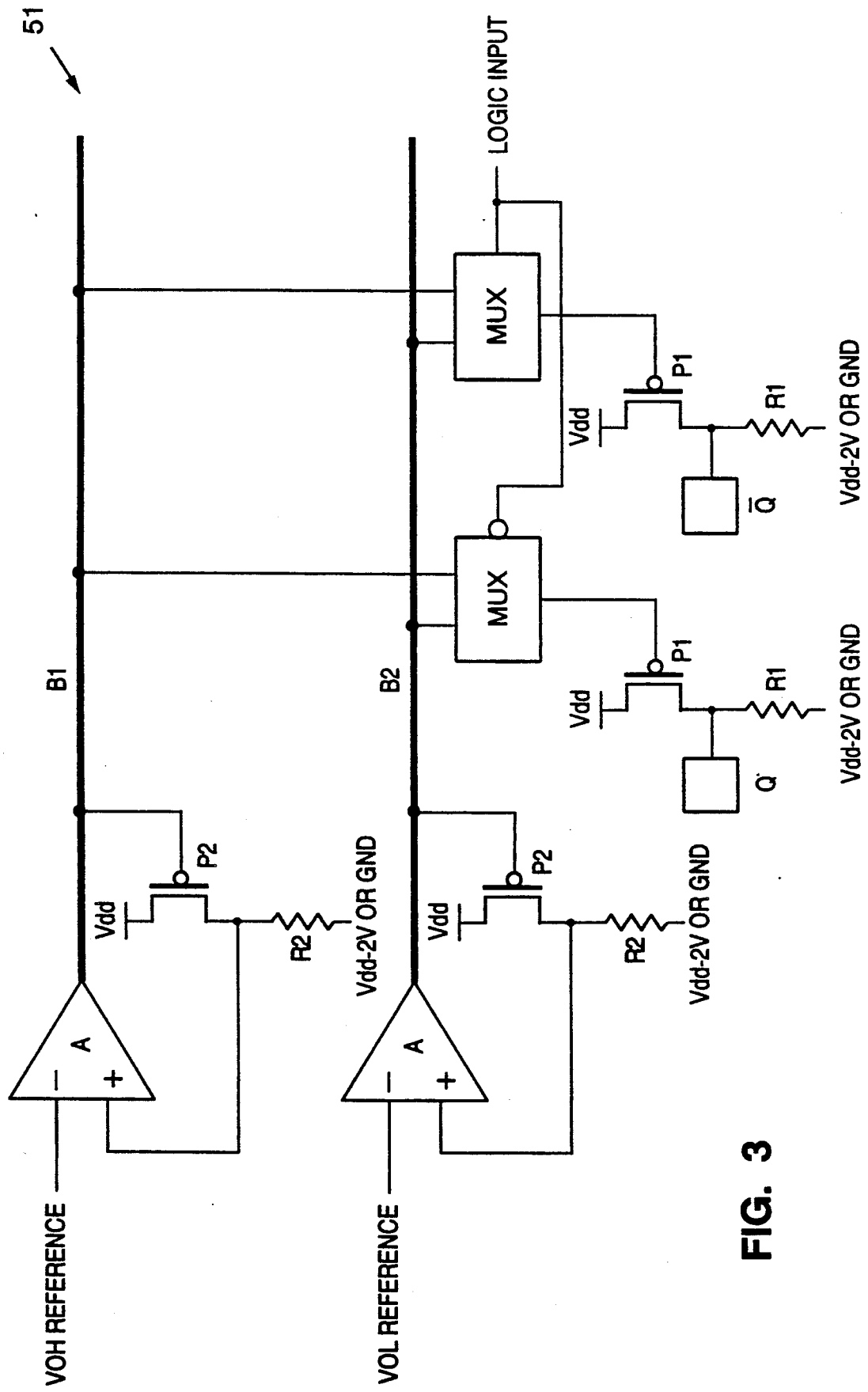
FIG. 3 is a schematic diagram illustrating an alternative embodiment of a CMOS-based ECL output buffer in accordance with the present invention.

FIG. 3 shows an alternative embodiment of the present invention wherein output buffer 51 uses the P-channel output driver transistor P1 as an inverter so that the termination resistor R1 can be connected to −2V or, conceivably, any other termination technique can be used. If two device pins were to be dedicated for the two bus feedback paths (i.e. dummy output pins, one fixed at the VOH level and one at the VOL level fully terminated), then it is possible to accommodate any termination technique and not be committed to serving Vcc-2V load terminated based systems.

More specifically, in the FIG. 3 embodiment of the invention, the output switch comprises an output driver P-channel transistor P1 having its gate connected to receive the transmission gate output signal, its drain connected to the output node, and its source connected to a positive supply voltage. The output node is connected to a negative supply voltage via the termination resistor R1.

Again, each of the operational amplifier feedback paths includes a feedback P-channel transistor P2 having its gate connected to the corresponding bus, its drain node connected to the inverting input of the corresponding operational amplifier, and its source node connected to the positive supply. The drain node is connected to a termination supply via a feedback resistor R2.

Again, the feedback P-channel transistor P2 may be identical to the output driver P-channel transistor P1 or can be a scaled version of the output driver P-channel transistor P1.

It should be understood that various alternatives to the embodiment to the invention described herein may be employed in practicing the invention. It is intended that the following claims define the scope of the invention and that methods and apparatus within the scope of these claims and their equivalents be covered thereby.

What is claimed is:

1. A CMOS-based ECL output buffer comprising:
   (a) a high level bus;
   (b) a first CMOS operational amplifier having its non-inverting input connected to receive a high ECL-level reference voltage and having its output connected to the high level bus, the first CMOS operational amplifier including a feedback path connected between the high level bus and the inverting input of the first CMOS operational amplifier such that the voltage on the high level bus corresponds to the high ECL-level reference voltage;
   (c) a low level bus;
   (d) a second CMOS operational amplifier having its non-inverting input connected to receive a low ECL-level reference voltage and having its output connected to the low level bus, the second CMOS operational amplifier including a feedback path connected between the low level bus and the inverting input of the second CMOS operational amplifier such that the voltage on the low level bus corresponds to the low ECL-level reference voltage;
   (e) at least one transmission gate having first and second inputs connected to the high and low ECL-level buses, respectively, and responsive to first and second logic states of a logic input control signal for providing the high ECL-level reference voltage and the low ECL-level reference voltage, respectively, as a transmission gate output signal; and
   (f) output switch means responsive to the transmission gate output signal for providing a corresponding buffer output signal to an output node wherein the output switch means comprises an output driver P-channel transistor having its gate connected to receive the transmission gate output signal, its drain connected to a negative supply voltage, and its source connected to the output node, the output node connected to a positive supply voltage via an output resistor.

2. A CMOS-based ECL output buffer as in claim 1 wherein the first CMOS operational amplifier feedback path includes a first feedback P-channel transistor having its gate connected to the high level bus, its drain connected to the negative supply voltage and its source node connected to the inverting input of the first CMOS operational amplifier, said source node connected to the positive supply voltage via a first feedback resistor, and wherein the second CMOS operational amplifier feedback path includes a second feedback P-channel transistor having its gate connected to the low level bus, its drain connected to the negative supply voltage and its source node connected to the inverting input of the second CMOS operational amplifier, said source node connected to the supply voltage via a second feedback resistor, the first and second feedback P-channel transistors being matched to the output driver P-channel transistor.

3. A CMOS-based ECL output buffer as in claim 1 wherein the first CMOS operational amplifier feedback path includes a first feedback P-channel transistor having its gate connected to the high level bus, its drain connected to the negative supply voltage and its source node connected to the inverting input of the first CMOS operational amplifier, said source node connected to the positive supply voltage via a first feedback resistor, and wherein the second CMOS operational amplifier feedback path includes a second feedback P-channel transistor having its gate connected to the low level bus, its drain connected to the negative supply voltage and its source node connected to the inverting input of the second CMOS operational amplifier, said source node connected to the supply voltage via a second feedback register, the first and second feedback P-channel transistors being scaled down versions of the output driver P-channel transistor.

4. A CMOS-based ECL output buffer comprising:
   (a) a high level bus;
   (b) a first CMOS operational amplifier having its inverting input connected to receive a high ECL-level reference voltage and having its output connected to the high level bus, the first CMOS operational amplifier including a feedback path connected between the high level bus and the non-inverting input of the first CMOS operational amplifier such that the voltage on the high level bus corresponds to the high ECL-level reference voltage;
   (c) a low level bus;

(d) a second CMOS operational amplifier having its inverting input connected to receive a low ECL-level reference voltage and having its output connected to the low level bus, the second CMOS operational amplifier including a feedback path connected between the low level bus and the non-inverting input of the second CMOS operational amplifier such that the voltage on the low level bus corresponds to the low ECL-level reference voltage;

(e) at least one transmission gate having first and second inputs connected to the high and low ECL-level buses, respectively, and responsive to first and second logic states of a logic input control signal for providing the high ECL-level reference voltage or the low ECL-level reference voltage, respectively, as a transmission gate output signal; and (f) output switch means responsive to the transmission gate output signal for providing a corresponding buffer output signal to an output node, the output switch means comprising an output driver P-channel transistor having its gate connected to receive the transmission gate output signal, its drain connected to the output node, and its source connected to a positive supply voltage, the output node connected to a negative supply voltage via an output resistor.

5. A CMOS-based ECL output buffer as in claim 4 wherein the first CMOS operational amplifier feedback path includes a first feedback P-channel transistor having its gate connected to the high level bus, its drain connected to the non-inverting input of the first CMOS operational amplifier, and its source node connected to the positive supply voltage, said drain node connected to the negative supply voltage via a first feedback resistor, and wherein the second CMOS operational amplifier feedback path includes a second feedback P-channel transistor having its gate connected to the low level bus, its drain node connected to the non-inverting input of the second CMOS operational amplifier, and its source node connected to the positive supply voltage, said drain node connected to the negative supply voltage via a second feedback resistor, the first and second feedback P-channel transistors being matched to the output driver P-channel transistor.

6. A CMOS-based ECL output buffer as in claim 4 wherein the first CMOS operational amplifier feedback path includes a first feedback P-channel transistor having its gate connected to the high level bus, its drain node connected to the non-inverting input of the first CMOS operational amplifier, said drain node connected to the negative supply voltage via a first feedback resistor, and wherein the second CMOS operational amplifier feedback path includes a second feedback P-channel transistor having its gate connected to the low level bus, its drain node connected to the non-inverting input of the second CMOS operational amplifier and its source node connected to the positive supply voltage, said drain node connected to the negative supply voltage via a second feedback resistor, the first and second feedback P-channel transistors being scaled down versions of the output driver P-channel transistor.

* * * * *